(12) United States Patent
McAuliffe

(10) Patent No.: US 6,421,805 B1
(45) Date of Patent: Jul. 16, 2002

(54) ROGUE PACKET DETECTION AND CORRECTION METHOD FOR DATA STORAGE DEVICE

(75) Inventor: Richard McAuliffe, Boulder, CO (US)

(73) Assignee: EXAByte Corporation, Boulder, CO (US)

( * ) Notice: Subject to any disclaimer, the term of this patent is extended or adjusted under 35 U.S.C. 154(b) by 0 days.

(21) Appl. No.: 09/192,809

(22) Filed: Nov. 16, 1998

(51) Int. Cl.[7] .......................... H03M 13/00; G11C 29/00
(52) U.S. Cl. ........................................ 714/756; 714/769
(58) Field of Search ................................ 714/756, 769, 714/770, 784

(56) References Cited

U.S. PATENT DOCUMENTS

| | | |
|---|---|---|
| 3,821,710 A | 6/1974 | Arciprete et al. |
| 3,962,727 A | 6/1976 | Kamimura et al. |
| 4,011,587 A | 3/1977 | Arter et al. |
| 4,099,211 A | 7/1978 | Hathaway |
| 4,106,065 A | 8/1978 | Ravizza |
| 4,125,881 A | 11/1978 | Eige et al. |
| 4,172,265 A | 10/1979 | Sakamoto et al. |
| 4,175,267 A | 11/1979 | Tachi |

(List continued on next page.)

FOREIGN PATENT DOCUMENTS

| | | |
|---|---|---|
| DE | 29 06 836 A1 | 9/1980 |
| JP | 56-93157 | 7/1981 |
| JP | 58-133665 | 2/1982 |
| JP | 57-55579 | 4/1982 |
| JP | 59-139157 | 1/1983 |

OTHER PUBLICATIONS

Sueng Ho Kim, Sang Wu kim, Chee Sun Won, "Decoding Strategies for Reed–Solomon Product Codes: Application to Digital Video Recording Systems", IEEE Transactions on Consumer Electronics, 38(1992) Aug. No. 3, New York, US.
Pizzi, New Audio Recoroding Formats, Broadcast Engineering, Feb. 1993, paragraph. 60–63.
NT–1, Apr. 1992.
Sasake, T., Asltad, J., Younker, M., The NT Digital Mcro Tape Recorder, Goddard Conference on Mass Storage Systems and Technologies, Sep. 22–24, 1992, paragraph. 143–157.

Primary Examiner—Albert Decady
Assistant Examiner—Joseph D. Torres
(74) Attorney, Agent, or Firm—Jessica Costa

(57) ABSTRACT

A method for detecting the location of falsely detected "good" data, or "rogue", packets in a data buffer is presented. A segment-level CRC is generated over, and associated with, a buffer segment, and recorded along with the segment data onto a storage medium. During data recovery, only packets that pass a packet-level error detection test are allowed in the data buffer. Once a data segment is complete, a segment-level CRC test is performed over the recovered segment-level CRC and the entire recovered segment data. The segment contains a rogue packet if the segment-level CRC test fails. Reed-Solomon syndromes are generated and used to locate and optionally correct the rogue packets.

10 Claims, 5 Drawing Sheets

U.S. PATENT DOCUMENTS

| | | | | |
|---|---|---|---|---|
| 4,215,370 | A | 7/1980 | Norris | |
| 4,257,075 | A | 3/1981 | Wysocki et al. | |
| 4,293,879 | A | 10/1981 | Heitmann et al. | |
| 4,357,639 | A | 11/1982 | Hama et al. | |
| 4,390,915 | A | 6/1983 | Matsuyama | |
| 4,394,694 | A | 7/1983 | Ninomiya et al. | |
| 4,404,690 | A | 9/1983 | Sakamoto | |
| 4,412,260 | A | 10/1983 | Stricklin et al. | |
| 4,420,778 | A | 12/1983 | Sakamoto | |
| 4,467,373 | A | 8/1984 | Taylor et al. | |
| 4,484,236 | A | 11/1984 | Wilkinson | |
| 4,486,796 | A | 12/1984 | Sakamoto | |
| 4,491,886 | A | 1/1985 | Saito et al. | |
| 4,492,991 | A | 1/1985 | Osada et al. | |
| 4,544,967 | A | 10/1985 | Louth | |
| 4,554,598 | A | 11/1985 | Tarbox et al. | |
| 4,581,662 | A | 4/1986 | Sato | |
| 4,609,947 | A | 9/1986 | Yamagiwa et al. | |
| 4,614,991 | A | 9/1986 | Murakami | |
| 4,620,245 | A | 10/1986 | Shimizu | |
| 4,628,372 | A | 12/1986 | Morisawa | |
| 4,628,383 | A | 12/1986 | Miyamoto | |
| 4,636,873 | A | 1/1987 | Eguchi | |
| 4,637,023 | A | 1/1987 | Lounsbury et al. | |
| 4,641,210 | A | 2/1987 | Ohyama | |
| 4,642,714 | A | 2/1987 | Miyamoto | |
| 4,644,414 | A | 2/1987 | Yamada et al. | |
| 4,651,239 | A | 3/1987 | Omori et al. | |
| 4,654,731 | A | 3/1987 | Froschl et al. | |
| 4,663,673 | A | 5/1987 | Doutsubo | |
| 4,665,447 | A | 5/1987 | Odaka | |
| 4,677,504 | A | 6/1987 | Yamazaki et al. | |
| 4,680,654 | A | 7/1987 | Shibuya | |
| 4,682,247 | A | 7/1987 | Doutsbo | |
| 4,688,109 | A | 8/1987 | Sangu | |
| 4,703,373 | A | 10/1987 | Oosaka | |
| 4,714,971 | A | 12/1987 | Sigiki et al. | |
| 4,717,974 | A | 1/1988 | Baumeister | |
| 4,726,028 | A | 2/1988 | Himeno | |
| 4,731,678 | A | 3/1988 | Takeuchi | |
| 4,737,865 | A | 4/1988 | Murakami et al. | |
| 4,739,420 | A | 4/1988 | Odaka et al. | |
| 4,757,911 | A | 7/1988 | Nakano et al. | |
| 4,758,904 | A | 7/1988 | Takahashi et al. | |
| 4,760,474 | A | 7/1988 | Takimoto | |
| 4,769,811 | A | 9/1988 | Eckberg et al. | |
| 4,774,605 | A | 9/1988 | Kato | |
| 4,786,011 | A | 11/1988 | Fujiwara et al. | |
| 4,788,685 | A | * 11/1988 | Sako et al. | 714/756 |
| 4,794,602 | A | 12/1988 | Tanaka et al. | |
| 4,796,115 | A | 1/1989 | Ohshima et al. | |
| 4,799,221 | A | 1/1989 | Fukami et al. | |
| 4,802,172 | A | 1/1989 | Fukami et al. | |
| 4,802,173 | A | 1/1989 | Baggen | |
| 4,812,924 | A | 3/1989 | Fukami et al. | |
| 4,821,129 | A | 4/1989 | Culp | |
| 4,835,628 | A | 5/1989 | Hinz et al. | |
| 4,843,495 | A | 6/1989 | Georgis et al. | |
| 4,845,577 | A | 7/1989 | Georgis et al. | |
| 4,897,739 | A | 1/1990 | Hasegawa et al. | |
| 4,918,546 | A | 4/1990 | Saito | |
| 4,930,027 | A | 5/1990 | Steele et al. | |
| 4,933,784 | A | 6/1990 | Oldershaw et al. | |
| 4,935,824 | A | 6/1990 | Nakano et al. | |
| 4,935,827 | A | 6/1990 | Oldershaw et al. | |
| 4,970,612 | A | 11/1990 | Renders et al. | |
| 4,977,469 | A | 12/1990 | Yokozawa | |
| 4,984,104 | A | 1/1991 | Takahashi et al. | |
| 5,003,411 | A | 3/1991 | Nagahara et al. | |
| 5,034,833 | A | 7/1991 | Marlowe | |
| 5,050,018 | A | 9/1991 | Georgis et al. | |
| 5,068,757 | A | 11/1991 | Hughes et al. | |
| 5,103,355 | A | 4/1992 | Steele | |
| 5,115,500 | A | 5/1992 | Larsen | |
| 5,142,422 | A | 8/1992 | Zook et al. | |
| 5,191,491 | A | 3/1993 | Zweighaft | |
| 5,251,077 | A | 10/1993 | Saitoh | |
| 5,262,905 | A | 11/1993 | Takagi et al. | |
| 5,327,305 | A | 7/1994 | Thomas | |
| 5,349,481 | A | 9/1994 | Kauffman et al. | |
| 5,414,570 | A | 5/1995 | Fry et al. | |
| 5,535,068 | A | 7/1996 | Hughes | |
| 5,602,694 | A | 2/1997 | Miles et al. | |
| 5,633,764 | A | 5/1997 | Ohta | |
| 5,768,298 | A | * 6/1998 | Nagai et al. | 714/769 |
| 5,781,688 | A | 7/1998 | Seong | |
| 5,872,997 | A | 2/1999 | Golson | |
| 5,953,177 | A | 9/1999 | Hughes | |
| 5,970,075 | A | * 10/1999 | Wasada | 714/784 |
| 5,993,056 | A | * 11/1999 | Varman et al. | 714/776 |
| 5,996,105 | A | * 11/1999 | Zook | 714/755 |
| 6,047,395 | A | * 4/2000 | Zook | 714/756 |
| 6,079,042 | A | * 6/2000 | Vaman et al. | 714/755 |
| 6,134,384 | A | * 10/2000 | Okamoto et al. | 386/116 |

* cited by examiner

ROGUE PACKET DETECTION AND CORRECTION METHOD FOR DATA STORAGE DEVICE

FIELD OF THE INVENTION

The present invention pertains generally to data integrity in data recording/recovery devices, and more particularly to a method for detecting and correcting falsely detected "good" data packets recovered from a storage medium.

RELATED PATENTS

The present invention is related to co-pending U.S. patent application entitled "Method And Apparatus For Logically Rejecting Previously Recorded Track Residue From Magnetic Media", invented by McAuliffe et al., and having an internal docket number of 9086/103 and a Ser. No. of 09/192,794, filed concurrently herewith on Nov. 16, 1998, and co-pending U.S. patent application entitled "A Method Of Reacquiring Clock Synchronization On A Non-Tracking Helical Scan Tape Device", invented by Blatchley et al., and having an internal docket number of 9086/108 and a Ser. No. of 09/192,808, filed concurrently herewith on Nov. 16, 1998, and co-pending U.S. patent application entitled "Method And System For Monitoring And Adjusting Tape Position Using Control Data Packets", invented by McAuliffe et al., and having an internal docket number of 9086/107 and a Ser. No. of 09/193,030, filed concurrently herewith on Nov. 16, 1998, and co-pending U.S. patent application entitled "Variable Speed Recording Method and Apparatus for a Magnetic Tape Drive", invented by Beavers et al., and having an internal docket number of 9086/101 and a Ser. No. of 09/176,079, filed on Oct. 20, 1998, and co-pending U.S. patent application entitled "Overscan Helical Scan Head for Non-Tracking Tap Subsystems Reading at up to 1× Speed and Method for Simulation of Same", invented by Blatchley et al., and having an internal docket number of 9086/104 and a Ser. No. of 09/176,013, filed on Oct. 20, 1998, and co-pending U.S. patent application entitled "Fine Granularity Rewrite Method and Apparatus for Data Storage Device", invented by Zaczek, and having an internal docket number of 9086/106 and a Ser. No. of 09/176,015, filed on Oct. 20, 1998, and co-pending U.S. patent application entitled "Multi-level Error Detection and Correction Technique for Data Storage Recording Device", invented by McAuliffe et al., and having an internal docket number of 9086/102 and a Ser. No. of 09/176,014, filed on Oct. 20, 1998, all of which are commonly owned and all of which are hereby incorporated by reference.

BACKGROUND OF THE INVENTION

Data storage devices, which are used in both short- and long-term capacities, are an integral part of modern computer systems. While factors such as costs, device form factor, storage media size and capacity, and recording and recovery times are of high importance, of primary concern is the ability to maintain data integrity.

Techniques have been developed to detect data errors. One commonly used error detection technique is known as a polynomial or cyclical redundancy check (CRC). CRC generators are preloaded with a generating polynomial $G(x)$ and treat data blocks as a polynomial $D(x)$. The data polynomial $D(x)$ is divided by the generating polynomial $G(x)$ to obtain a quotient $Q(x)$ and remainder $R(x)$, such that $D(x)/G(x)=Q(x)+R(x)$, where $R(x)$ is known as the cyclic redundancy check (CRC). CRCs are generated over the data and recorded along with the data to the storage media. During the recovery of the data from the storage media during a later session, the CRC is regenerated from the recovered data and compared to the recorded CRC accompanying the data to determine whether or not the data contains an error. CRCs are useful in detection of a high percentage of data errors; however, because binary division is based on performing a logical exclusive OR (XOR) of a series of bits, and therefore the right combination of position and number of errors could result in the same CRC value as that of the correct value of a data packet, CRC checks cannot guarantee accuracy. Accordingly, occasionally a packet containing an error is falsely accepted as a good packet because the error is undetectable by the CRC generator using the particular predefined generating polynomial. This falsely detected "good" packet is herein termed a "rogue" packet.

Accordingly, in order to ensure data integrity, a need exists for a method of detecting and correcting rogue packets in data recovery systems.

SUMMARY OF THE INVENTION

The present invention is a novel method for detecting rogue packets in a data buffer. In accordance with the invention, a segment-level CRC is generated across the data and during the recording session by a segment CRC generator and recorded along with the data to the storage medium.

During a data recovery session, only those packets which pass a packet-level error detection test are allowed into the data buffer. When a buffer segment is filled with so-called "good" packets, and the segment-level CRC associated with the segment is recovered from the storage medium, a segment-level error detection test is performed across the segment-level CRC and the contents of the buffer segment. The segment-level error detection test will detect an error if the segment contains a rogue packet.

If the segment contains a rogue packet, a Reed-Solomon syndrome pair is calculated across each row in the buffer segment. If both syndromes are zero, the row does not contain a rogue packet. If both syndromes are not zero, the syndrome pair is used to calculate the location of a potential rogue packet. Once the location of all the potential rogue packets are determined, the potential rogue packets are effectively erased and error correction is performed on the segment to attempt to correct the rogue packets.

In accordance with one embodiment of the invention, a data segment includes a plurality of data packets arranged in a square array. For each data segment, there are two error correction code (ECC) packets per row, column, and diagonal that are used to correct either one or two missing packets in any data row, column, or diagonal. The ECC packets contain Reed-Solomon two redundancy data. Each data segment has a corresponding packet status table (PST) that contains an entry for each data and ECC packet. Each PST entry indicates whether its corresponding packet has been received and as valid. In addition, the PST contains a count of the number of good packets present in each row, column, and diagonal, and a total number of good data packets in the segment. These counts are used by a segment correction processor (SCP) to determine when correction can be applied to the segment. The SCP is responsible for all segment correction activities.

Using a Reed-Solomon correction code with two redundant code words provides the ability to locate a single error and correct it, or to correct two errors if the locations are known. To correct two errors, the known locations must be erased or reset to zero so that they do not contribute an error term to the syndrome calculations.

During normal operation, the SCP uses only erasure correction for correcting either single- or two-packet errors. Under error recovery conditions, after a segment CRC test has failed, the SCP determines the location of a rogue packet using the first form of error location and correction. The SCP calculates the syndromes for each row. The resulting syndromes will both be zero if the row has only good packets. If the row has one or more rogue packets, the syndromes are non-zero. The SCP then uses both syndrome terms to calculate the location of a potential rogue packet. If there is only one rogue packet, the corresponding PST entry is marked as not received, and its corresponding row, column, and diagram count, along with the total good packet count are each decremented, and the SCP is restarted for normal correction. The SCP will then correct the missing packet and repeat the segment CRC test. Assuming that it passes the segment CRC test, the segment is released to the host for reading and the read process continues.

The rogue packet detection portion of the SCP searches each row including the row ECC and column ECC. The SCP can determine a possible column location in each row that one or more rogue packets are located in. A simple range check of the rogue packet column location can give some credence to the result. Namely, if it exceeds the number of columns in the PST, there is probably more than one rogue packet in the row.

After a rogue packet is found, rogue packet detection is resumed until the last row is processed. Each time a rogue packet is located, the SCP sets a "rogue found" bit. Each time a rogue packet is located, or the last row has been processed, the SCP sets a "done" bit.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A technique for detecting and correcting rogue packets in a data recording/recovery device in order to provide increased data integrity is described in detail hereinafter. For purposes of illustration, the invention is described in the context of a magnetic tape drive; however, the method of the invention may be employed in any application which performs error detection and correction on data.

Figure 1:
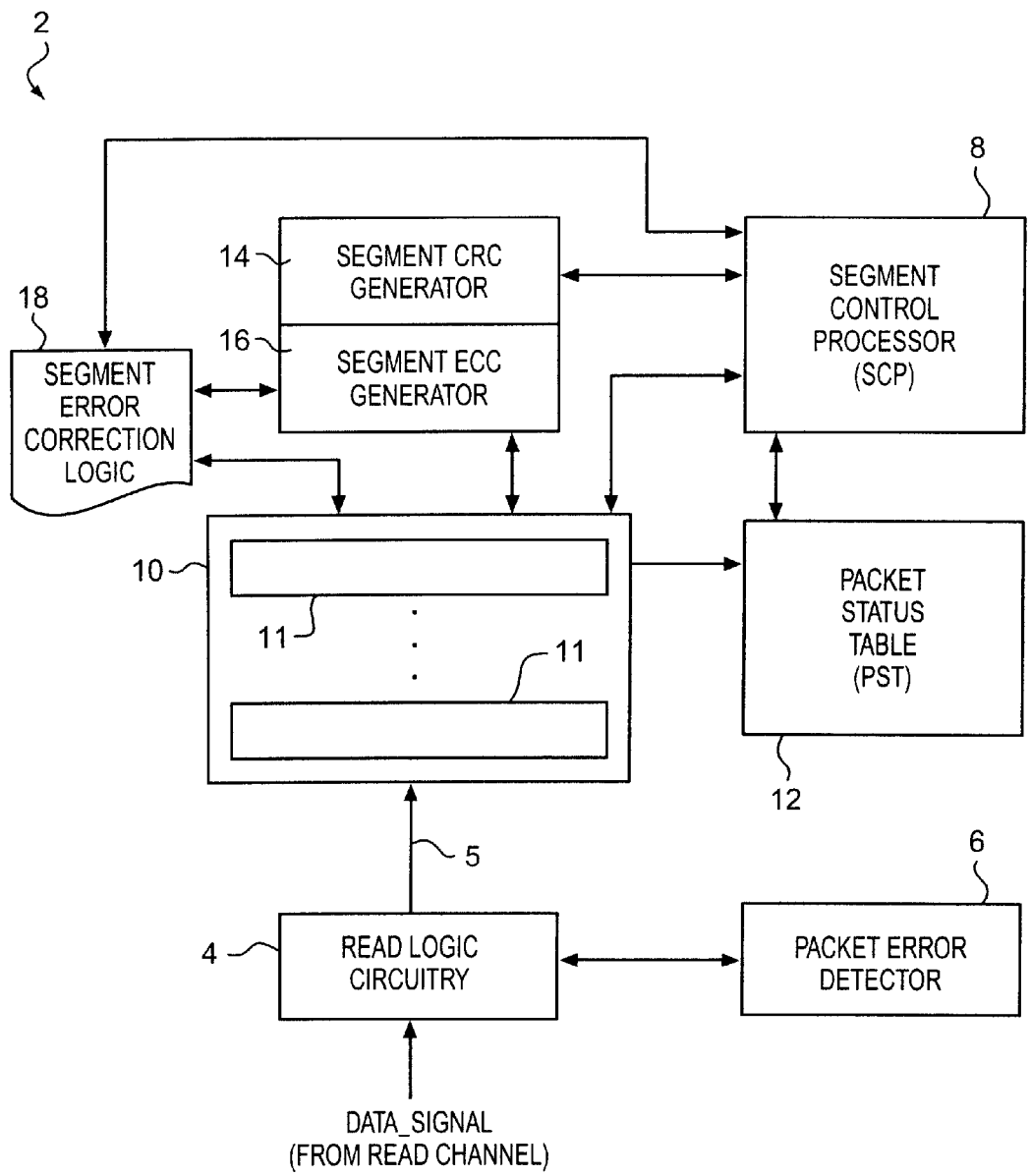
FIG. 1 is a block diagram of a system in which the invention operates.

Turning now to FIG. 1, there is a shown a block diagram of a system 2 in which the invention operates. System 2 includes a data buffer 10, an associated packet status table (PST) 12, read logic circuitry 4, a data packet error detector 6, a segment control processor (SCP) 8, and a segment CRC generator 14, a segment ECC generator 16 and a segment error correction circuit 18. Read logic circuitry 4 processes incoming data DATA_SIGNAL from a read channel (not shown) that recovers data from a storage media (not shown), such as a magnetic tape. Read logic circuitry 4 decodes and formats the data into packets 5. Each data packet 5 includes a packet-level error detection code such as a packet-level CRC code that is generated over the data portion of the packet. Error detection is performed on each packet 5 by packet error detector 6. If an error is detected in a packet 5, the error is either corrected using error correction techniques or the packet 5 is discarded. A packet is not allowed into the data buffer 10 unless and/or until it passes the packet-level error detection test. If a packet 5 passes the error detection test because no errors are detected in the packet 5, it is sent to its appropriate location in data buffer 10. Various techniques, beyond the scope of the present invention, are known in the art for determining the appropriate location of a packet 5 in the data buffer 10. In the illustrative embodiment, data is sent to and from a host system (not shown) in data segments 11. Data buffer 10 is large enough to store multiple data segments 11 at any given time.

In accordance with the invention, during a data recording session a segment error detection code such as a cyclical redundancy code, hereinafter "recorded segment CRC", is generated over a given data buffer segment 11 and recorded along with the segment data to the storage medium. Various means for associating a recorded segment CRC with a given segment 11 could be implemented. For example, the recorded segment CRC could be stored in a special control packet that is associated with the segment 11 and identifiable as such by the read logic circuitry 4.

During a data recovery session, read logic circuitry 4 controls the decoding and placement of data packets in buffer 10. Again, no data packet 5 is allowed in data buffer 10 unless it passes the packet-level error detection test without errors.

Figure 2:
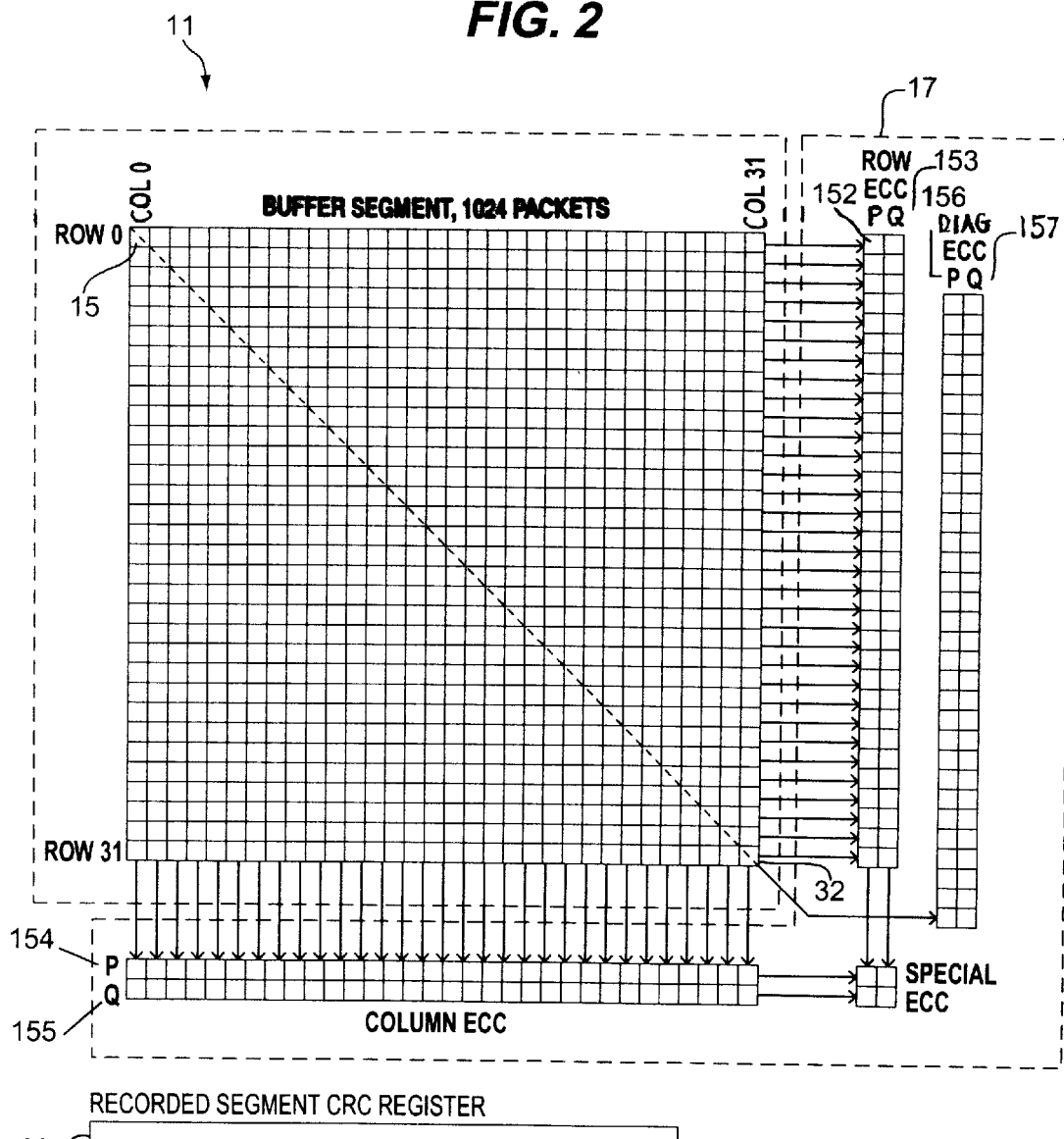
FIG. 2 is a diagram illustrating one embodiment of the contents and organization of a buffer segment implemented in accordance with the invention.

FIG. 2 illustrates one embodiment of the contents and organization of a segment 11 of a multi-segment data buffer 10 implemented in accordance with the invention. In this embodiment, segment 11 comprises a set of fixed-size buffer packets 15, each for storing one packet 5. In the illustrative embodiment, the segment 11 comprises 1024 buffer packets 15 arranged in a 32-by-32 array.

Segment 11 also comprises a pair of error correction code (ECC) packets 17 P and Q for each row, column, or diagonal that are used to correct either one or two missing packets in its associated row, column, or diagonal. The row, column, and diagonal ECC packets 17 consist of a pair of Reed-Solomon redundancy terms P and Q.

As known by those skilled in the art, Reed-Solomon error correction techniques allow the number of correctable errors to be designed into a system according to the number of redundant terms. The Reed-Solomon error correction techniques implemented in the illustrative embodiment of the invention are described in detail in Watkinson, John, "D-3 Digital Video Recorder", Focal Press, Oxford, pp. 145–152. In the illustrative embodiment, a two-redundancy code is used by calculating a pair of redundant terms P and Q for each row, column and diagonal. The redundant terms P and Q are solutions to the equations:

$$S_0 = B_{31} \oplus B_{30} \oplus B_{29} \oplus \ldots \oplus B_1 \oplus B_0 \oplus P \oplus Q = O; \text{ and}$$

$$S_1 = a^{34} B_{31} \oplus a^{33} B_{30} 61\ a^{32} B_{29} \oplus \ldots \oplus a^4 B_1 \oplus a^3 B_0 \oplus a^2 P \oplus a^1 Q = O,$$

where $S_0$ and $S_1$ are the syndromes, P and Q are the redundant terms, $a^1$ through $a^{34}$ are the polynomial coefficients, and $B_0$ through $B_{31}$ are the bit values. As evident from the above equations, the value of $S_0$ is simply the parity of all the terms $B_{31}$ through $B_0$ and P and Q. The syndrome is the same error bit pattern, but it has been raised to a different power of a depending on the position of the error symbol in the block. If the position of the error is represented by symbol k, then $S_0 \times a^k = S_1$. Thus, $a^k = S_1/S_0$. The error symbol can be located by multiplying $S_0$ by various powers of a until the product is the same as $S_1$. The value of k that results in $a^k = 1$ corresponds to the position of the symbol that contains the error. Once the position of the error is known, the correct value of the erroneous term is obtained by adding $S_0$ to it. The above-described process is used to locate and correct a single error when the location of the error is unknown.

Reed-Solomon two-redundant term systems can also be used to correct two terms if the location of the errors is known. One method of doing this is to set the erroneous terms to zero, (i.e., "erase" the terms) and then calculate the syndromes $S_0$ and $S_1$ and solve for the erased terms.

As previously described, as data is decoded from incoming data stream DATA_SIGNAL, read logic circuitry 4 places those data packets 5 that pass the packet-level error detection test in their correct buffer packet 15 locations in segment 11. In addition, when the recorded segment CRC associated with the segment 11 is recovered, it is stored in one of the buffer packets 15, or, in the alternative, is stored temporarily in a recorded segment CRC register, shown at 20 in FIG. 2.

Figure 3:
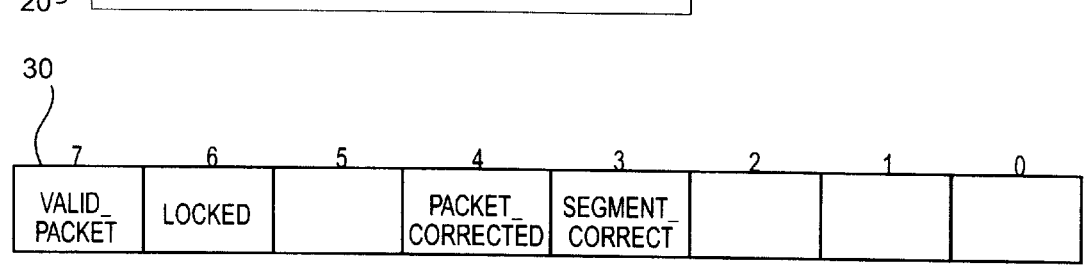
FIG. 3 is a diagram illustrating one embodiment of a packet status table (PST) entry.
Figure 4:
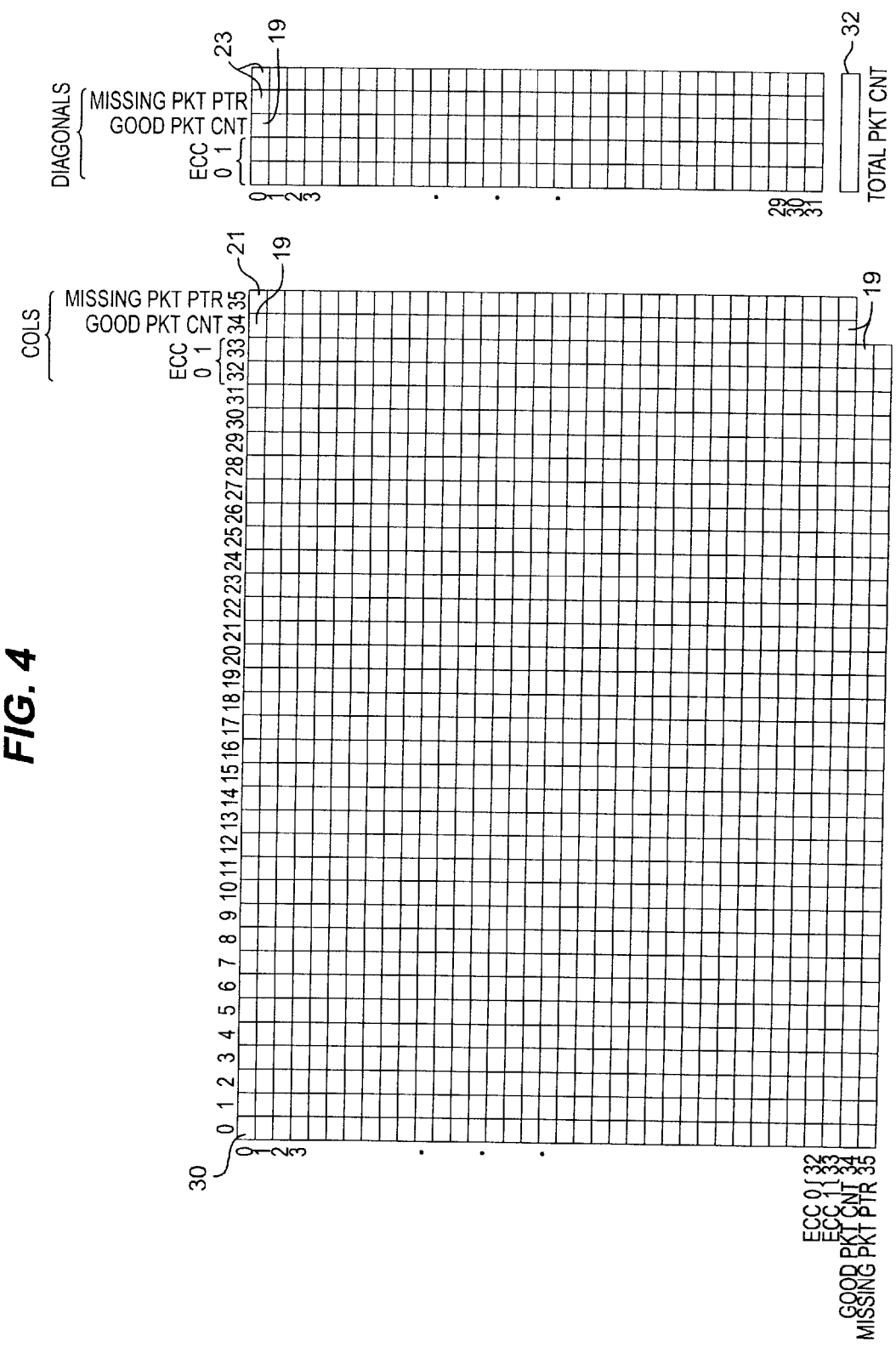
FIG. 4 is a diagram illustrating an example embodiment of a PST implemented in accordance with the invention.

In the illustrative embodiment, each segment 11 has a corresponding PST 12 which contains an entry corresponding to each buffer packet 15 and ECC packet 17 in the segment 11 and which is updated as data packets 5 are recovered and placed in the data buffer 10. Each PST entry 30 indicates whether its associated buffer packet 15 has been received and is valid. In one embodiment, illustrated in FIG. 3, each PST entry comprises a byte with bits as follows: VALID_PACKET (bit 7) which is set if the corresponding packet has been received and contains no errors detectable by the packet-level error detector; LOCKED (bit 6) which is a semaphore lock bit that is set when the PST is being updated; PACKET_CORRECT (bit 5) which is set to indicate that the packet was corrected by packet correction logic; SEGMENT_CORRECT which is set to force the correction of the associated buffer packet 15 by segment-level error correction circuitry 18. FIG. 4 illustrates an example embodiment of a PST 12 implemented in accordance with the invention. Each PST 12 also contains a good packet count 19 for each row, column, and diagonal which indicates the total number of good packets present in its associated row, column, and diagonal, and a total packet count 32 Which indicates the total number of good packets present in the segment 11. The counts are used by the SCP 8 to determine when correction can be applied to the segment 11. Each PST 12 also includes a missing packet pointer for each row, column, and diagonal that temporarily stores a pointer to a missing packet in its associated row, column, or diagonal.

The segment correction processor (SCP) 8 manages all segment correction activities. During a recovery session, SCP 8 monitors the PST 12 to locate as-yet "missing" buffer packets 15 that can be reconstructed through error correction. For example, as a segment 11 begins to fill, if a row, column, or diagonal becomes full less one or two "missing" packets, the segment error correction logic 18, with the assistance of the segment ECC generator 16 and under the control of SCP 8, is able to reconstruct the missing packets. Because every packet lies in a row, column, and diagonal, the reconstruction of one or two missing packets along one of the three different patterns may fill out at least one of the other two patterns enough such that the missing packets located in that pattern can then be reconstructed. For example, if a row is missing only a single packet, error correction is performed on the entire row using the two unique redundancy code row ECC packets P 152 and Q 153 to reconstruct the missing packet. The reconstruction of the missing packet may fill out the diagonal that the reconstructed packet lies in enough that it is only missing a single other packet. Error correction is then performed on the reconstructed packet's diagonal to reconstruct the missing packet in the diagonal. This process continues until all of the packets in the segment are recovered or reconstructed.

In the preferred embodiment, multi-layer redundancy is provided by pairs P and Q of redundant codes generated over a plurality of patterns of packets 15 of a segment 11 of buffer 10. In the illustrative embodiment, the plurality of patterns include rows, columns, and diagonals. Other patterns may be used. In addition, error correction is performed over all of the first redundant codes P for both row and column ECC codes, and all of the second redundant codes Q for both row and column ECC codes to generate special ECC codes 158.

Segment correction processor (SCP) 8 communicates with a Reed-Solomon syndrome generator 16 and error correction circuit 18 that provides for a one- or two-packet correction in any row, column, or diagonal of segment 11 using erasure pointer correction. Row redundancy is provided by row ECC packets P 152 and Q 153 for each row (O through 31) of buffer segment 11. Column redundancy is provided by column ECC packets P 154 and Q 155 for each column (0 through 31) of buffer segment 11.

Diagonal redundancy is provided by diagonal ECC packets P 156 and Q 157 for each diagonal (0 through 31) of buffer segment 11. The diagonals are defined to each include 32 packets. In one embodiment, a given diagonal N starts at column 0 and row N, and the next element of the diagonal is found by incrementing both the current column number and current row number, modulo 32. Table 1 illustrates the calculation of the diagonals for this embodiment.

TABLE 1

| DIAGONAL # | STARTING ROW | STARTING COLUMN | ENDING ROW | ENDING COLUMN |
|---|---|---|---|---|
| 0 | 0 | 0 | 31 | 31 |
| 1 | 1 | 0 | 0 | 31 |
| 2 | 2 | 0 | 1 | 31 |
| N | N | 0 | N-1 | 31 |

Four special ECC packets 158 are generated from the 64 column ECC packets. These four special ECC packets 158 are used to correct missing row ECC packets 152, 153 or column ECC packets 154, 155.

Figure 5:
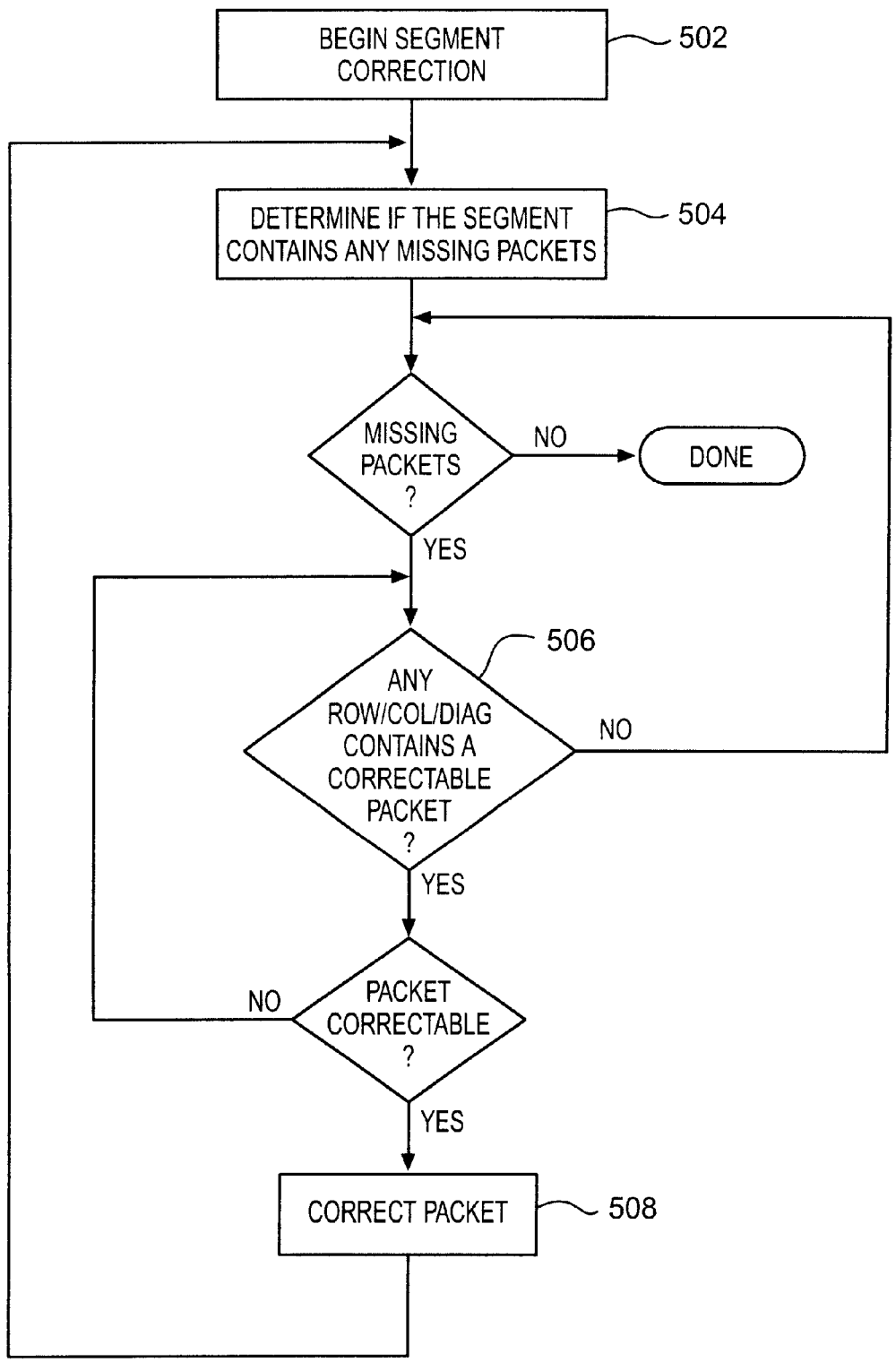
FIG. 5 is a flowchart illustrating one embodiment of a method 500 for performing error correction during a normal recovery session.

FIG. 5 is a flowchart illustrating one embodiment of a method 500 for performing error correction during a recovery session as implemented in SCP 8. SCP is triggered in step 502 to begin segment correction. Once the SCP is triggered to begin, in step 504 SCP 8 scans the PST 12 to determine whether the buffer segment contains any missing packets. In the illustrative embodiment, SCP 8 scans the good packet count 19 of each PST entry 30 corresponding to each row, each column, and each diagonal. If all rows, columns, and diagonals have a good packet count 19 equal to the maximum respective number of rows, columns and diagonals (e.g., 32 in the illustrative embodiment), all of the data packets 15 are received and valid, and the normal segment correction method is complete.

If any data packets are missing from the data buffer, in step 506 the SCP 8 scans each instance of every predefined buffer packet pattern to determine whether any one or two packets is correctable. In the illustrative embodiment, SCP scans the good packet count 19 of each PST entry 30 corresponding to each row, each column, and each diagonal. If any row, column, or diagonal has a good packet count 19 that is less by one or two of a total row/column/diagonal count (e.g., 32 in the illustrative embodiment), that particular row/column/diagonal instance is correctable to recover the missing packet(s) of that instance. Step 506 is repeated until a correctable instance is detected or the buffer segment 11 becomes full (indicated in the illustrative embodiment by the total packet count 32 reaching a value of 1220).

If a correctable instance is detected, packet correction is performed in step 508. In the preferred embodiment, packet correction is performed in accordance with Reed-Solomon error correction principles. The SCP 8 uses erasure correction for correcting either single-or two-packet errors. Using a Reed-Solomon correction code with two redundant code words P and Q provides the ability to locate a single error and correct it, or to correct two errors if the locations are known. To correct two errors, the known locations are effectively erased so that they do not contribute an error term to the syndrome $S_0$, $S_1$ calculations. In addition, it is possible to correct only one location with erasure correction. Steps 504–508 are repeated until all of the data packets 15 and ECC packets 17 are present in the segment.

When all of the buffer packets 15 and ECC packets 17 in a buffer segment 11 are filled in by the read logic circuitry 4, segment-level error detection is performed to determine whether the segment contains any rogue packets. This is performed under the control of SCP 8 by generating a segment-level CRC over the recorded segment CRC and all of the buffer packets 15 that contain a valid packet 5 and ECC packets 17. In the illustrative embodiment, the CRC generating polynomial used to calculate the segment CRC is:

$$X[32]+X[26]+X[23]+X[22]+X[16]+X[12]+X[7]+X[5]+X[4]+X[2]+X[1]+X[0].$$

If the segment CRC calculated over all buffer packets 15 containing valid data and the recorded segment CRC by segment CRC generator 14 has a value of zero, all of the data in the segment 11 is correct and segment 11 does not contain any rogue packets.

Because the segment-level CRC is calculated over all the data packets in the segment 11, rogue packets that passed the packet-level CRC test, and that are therefore allowed in the buffer 10, generally cause the segment-level CRC test to fail. The detection of the presence of a rogue packet in a segment 11 is heightened by the use a different CRC generating polynomial for the segment CRC calculation.

Upon detection of the presence of a rogue packet in a segment 11 by the failure of the segment-level CRC test, the packet status table (PST) 12 is employed in the detection of the location of rogue packets. SCP 8 determines the location of a rogue packet by calculating the ECC syndromes $S_0$, $S_1$ for each row ROW[0:31] of the segment 11. The resulting syndromes $S_0$, $S_1$ should both be zero if the row contains only good packets. If the row has one or more rogue packets, the syndromes $S_0$ and $S_1$ will be non-zero. The SCP 8 then uses both syndrome terms $S_0$, $S_1$ to calculate the location of a potential rogue packet. The calculated location is only potentially correct using the two-syndrome technique of the illustrative embodiment since only a single error can be corrected using two syndrome terms $S_0$, $S_1$ when the location of the error is unknown. Thus, if the row contains more than one rogue packet, the calculation of the location k of the erroneous packet using only two syndrome terms $S_0$, $S_1$ will be incorrect. However, as will be appreciated by those skilled in the art, the addition of redundant terms and calculation of additional syndromes will allow the detection of the location of additional rogue packets. After the location of a rogue packet has been determined, the packet is effectively erased by modifying the PST entry corresponding to the location of the rogue packet to indicate that the rogue packet has not been received and is not valid. This is done in the illustrative embodiment by clearing the PACKET_VALID bit. The SCP 8 is restarted to correct the rogue packet.

Figure 6:
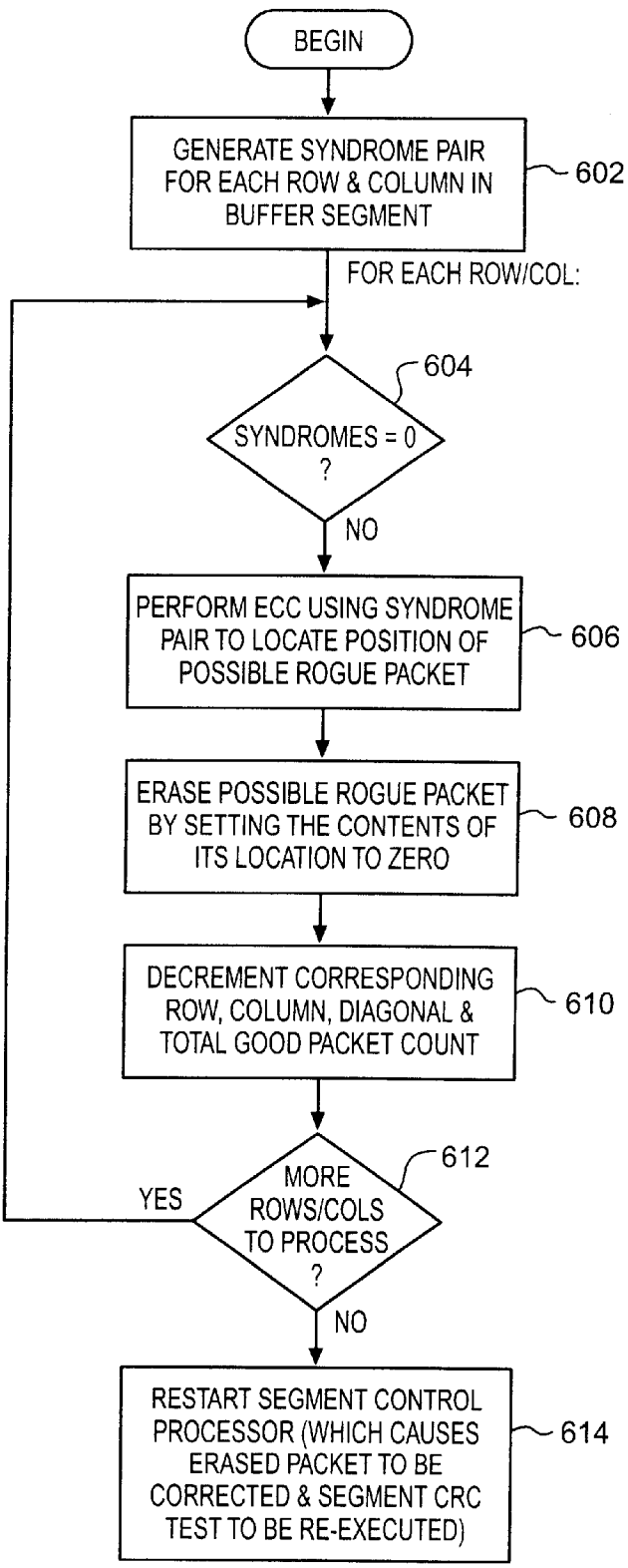
FIG. 6 is a flowchart of one embodiment of a method in accordance with the invention for detecting the location of a rogue packet.

FIG. 6 is a flowchart of one embodiment of a method 600 for detecting the location of a rogue packet. Method 600 is triggered by the detection of a segment CRC failure. In the illustrative embodiment, upon detection of a segment CRC failure, the SCP 8 is signaled to begin executing method 600 for detecting the location of and correcting rogue packets. In a first step 602, SCP 8 causes a pair of syndromes $S_0$, $S_1$ to be generated for each row [0:31] of the buffer segment. For each row, SCP 8 detects whether the pair of syndromes $S_0$, $S_1$ are both zero in step 604, and if not, causes segment ECC generator 16 to use the syndrome pair $S_0$, $S_1$ to locate the column position of a possible rogue packet in step 606. Once the location of a possible rogue packet is determined, the contents of that location are effectively erased in step 608, and in step 610 the row, column, and diagonal counts associated with the erased location, along with the total good packet count, are decremented, and the missing pointers are reset to zero. If more rows exist to be processed, as determined in step 612, steps 604 through 612 are repeated. When all rows have been processed, the SCP 8 is restarted in step 614. At this point, the SCP 8 detects that there are packets missing from data segment 11, and the missing packets are corrected where possible. Once all the missing packets are filled in, the segment CRC test is re-executed. If all of the possible rogue packet locations were correctly identified, the segment CRC test will pass.

As part of an error recovery procedure, it may be necessary to block specific packets from being read and stored in the data segment. This is possible by setting the SEGMENT_CORRECT bit in the PST entry associated with the packet. The read logic can look at this bit before allowing a packet to be stored in the buffer at the PST entry's associated buffer packet location. This forces these packets to be corrected by the SCP and blocks the same packet from being read from tape on a subsequent reread.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A method for detecting rogue packets in a segment of data recovered from a storage medium, comprising:
    recovering in any order a plurality of packets belonging to a segment of data from said storage medium, each said packet comprising a data packet and an associated packet-level error detection and/or error correction code;

detecting and/or correcting each said recovered data packet to be error-free using said packet-level error detection and/or correction code associated with said recovered data packet;

recovering a segment error detection code from said storage medium, said segment error detection code having been generated over all of said plurality of data packets in said segment of data prior to recording said segment and said segment error detection code onto said storage medium; and when each said plurality of data packets belonging to said segment have been recovered and detected and/or corrected to be error-free, performing error detection across said recovered segment of data using said recovered segment error detection code, wherein an error indicates the presence of at least one rogue data packet in said segment of data.

2. A method in accordance with claim 1, comprising:

locating potential rogue packets from among said data packets in said segment;

performing error correction to reconstruct said potential rogue packets.

3. A method in accordance with claim 2, wherein said plurality of recovered data packets are partitioned into a plurality of packet subsets, said method comprising:

for each subset of said plurality of recovered data packets, recovering an associated set of redundant error correction codes, said associated set of error correction codes having been generated over said subset of said plurality of data packets prior to recording said subset of said plurality of data tracks and said associated set of error correction codes onto said storage medium; and performing error correction over said subset of said plurality of data packets to locate any potential rogue packets.

4. A method in accordance with claim 3, comprising:

erasing said located potential rogue packets; and for each located rogue packet, performing error correction on said located rogue packet using said redundant error correction codes associated with said subset of plurality of data packets in which said located rogue packet is a member.

5. A method in accordance with claim 1, 2, 3, or 4, comprising:

determining whether each said recovered data packet should be not be processed; and if said recovered data packet should not be processed:
discarding said recovered data packet; and
reconstructing said discarded data packet using error correction.

6. An apparatus for detecting rogue packets in a segment of data recovered in any order from a magnetic storage medium based on a segment error detection code having been generated over all of said plurality of data packets in said segment of data prior to recording said segment and said segment error detection code onto said storage medium, said recovered segment of data comprising a plurality of data packets, comprising:

a packet error detection and/or error correction circuit which for each of said plurality of recovered data packets performs error detection on said recovered data packet and if an error is detected either corrects said recovered data packet or discards said recovered data packet;

segment error detection circuitry which, when each said plurality of data packets belonging to said segment have been recovered and detected and/or corrected to be error-free, performs error detection across said recovered segment of data and said recovered segment error detection code, wherein an error indicates the presence of at least one rogue data packet in said segment of data.

7. An apparatus in accordance with claim 6, comprising:

segment error correction circuitry which locates potential rogue packets from among said plurality of data packets in said segment of data and performs error correction to reconstruct said potential rogue packets.

8. An apparatus in accordance with claim 7, wherein:

said segment error correction circuitry performs error correction over a plurality of packet subsets and a plurality of sets of redundant error correction codes each respectively associated with one of said plurality of packet subsets, said plurality of packet subsets each comprising a partitioned subset of said plurality of data packets, to thereby locate any potential rogue packets; and wherein each of said sets of redundant error correction codes were generated over its respectively associated packet subset prior to recording its respectively associated packet subset and said set of redundant error correction codes onto said storage medium.

9. An apparatus in accordance with claim 8, wherein:

said segment error correction circuitry erases said located potential rogue packets and for each located rogue packet, performs error correction on said located rogue packet using said set of redundant error correction codes associated with said packet subset in which said located rogue packet is a member.

10. A method in accordance with claim 6, 7, 8, or 9, comprising:

an indicator for indicating that one or more of said recovered data packets should be not be processed; and wherein said segment error correction circuitry reconstructs said recovered data packets that said indicator indicates should not be processed.

* * * * *